(12) United States Patent
Bai

(10) Patent No.: US 11,094,910 B2
(45) Date of Patent: Aug. 17, 2021

(54) PIXEL DISPLAY COMPONENT, SCREEN DISPLAY COMPONENT, DISPLAY SCREEN, AND TERMINAL

(71) Applicant: Beijing Xiaomi Mobile Software Co., Ltd., Beijing (CN)

(72) Inventor: Jian Bai, Beijing (CN)

(73) Assignee: Beijing Xiaomi Mobile Software Co., Ltd., Beijing (CN)

( * ) Notice: Subject to any disclaimer, the term of this patent is extended or adjusted under 35 U.S.C. 154(b) by 0 days.

(21) Appl. No.: 16/708,677

(22) Filed: Dec. 10, 2019

(65) Prior Publication Data
US 2020/0373514 A1 Nov. 26, 2020

(30) Foreign Application Priority Data

May 24, 2019 (CN) .......................... 201910441948.3

(51) Int. Cl.
*G09G 3/30* (2006.01)
*H01L 51/52* (2006.01)
*G09G 3/3208* (2016.01)
*H01L 27/32* (2006.01)

(52) U.S. Cl.
CPC ....... *H01L 51/5218* (2013.01); *G09G 3/3208* (2013.01); *H01L 27/3246* (2013.01); *H01L 27/3283* (2013.01)

(58) Field of Classification Search
CPC ............ H01L 51/5218; H01L 27/3283; H01L 27/3246; H01L 27/326; H01L 51/5234; H01L 51/5209; H01L 51/5206; H01L 27/3244; H01L 32/3234; G09G 3/3208; G09G 3/3258; G09G 3/3225; G09G 2360/144; G09G 2300/0439; G09G 3/32
See application file for complete search history.

(56) References Cited

U.S. PATENT DOCUMENTS

| 9,305,989 B2 | 4/2016 | In et al. |
| 2012/0169683 A1 | 7/2012 | Hong |
| 2013/0187131 A1 | 7/2013 | Chung et al. |

(Continued)

FOREIGN PATENT DOCUMENTS

| CN | 107123745 B | 12/2018 |
| CN | 104795434 B | 1/2019 |

(Continued)

OTHER PUBLICATIONS

Extended European Search Report in the European Application No. 20151459.3 dated May 28, 2020.

(Continued)

*Primary Examiner* — Adam R. Giesy
(74) *Attorney, Agent, or Firm* — Finnegan, Henderson, Farabow, Garrett & Dunner, L.L.P.

(57) ABSTRACT

A pixel display component used in a display screen, includes a light-emitting unit and an anode. The anode includes a first anode portion and a second anode portion arranged in a direction parallel to the display screen. The first anode portion includes a light-transmitting material, and the second anode portion includes a non-light-transmitting material. The light-emitting unit is arranged between a cathode and the anode of the display screen, and the anode is arranged between a substrate of the display screen and the light-emitting unit.

16 Claims, 9 Drawing Sheets

(56) References Cited

U.S. PATENT DOCUMENTS

| | | |
|---|---|---|
| 2016/0093250 A1 | 3/2016 | Lee |
| 2017/0178566 A1 | 6/2017 | Xu et al. |
| 2019/0206953 A1 | 7/2019 | Hsieh et al. |
| 2020/0328256 A1* | 10/2020 | Lee .................... H01L 51/5234 |

FOREIGN PATENT DOCUMENTS

| | | |
|---|---|---|
| CN | 109119451 A | 1/2019 |
| CN | 109273500 A | 1/2019 |
| RU | 2446507 C2 | 3/2012 |
| RU | 2690769 C1 | 6/2019 |
| WO | WO 2017/126153 A1 | 7/2017 |
| WO | WO 2019/015605 A1 | 1/2019 |

OTHER PUBLICATIONS

Office Action of Russian Application No. 2019141632/28 dated May 13, 2020.
International Search Report of counterpart PCT Application No. PCT/CN2019/098348, dated Feb. 20, 2020.
English version of International Search Report for corresponding International Application No. PCT/CN2019/098348, dated Feb. 20, 2020.

* cited by examiner

US 11,094,910 B2

PIXEL DISPLAY COMPONENT, SCREEN DISPLAY COMPONENT, DISPLAY SCREEN, AND TERMINAL

CROSS-REFERENCE TO RELATED APPLICATIONS

The present application is based upon and claims priority to Chinese Patent Application No. 201910441948.3, filed on May 24, 2019, the entire content of which is incorporated herein by reference.

TECHNICAL FIELD

The present disclosure relates to the field of display technologies, and more particularly, to a pixel display component, a screen display component, a display screen, and a terminal.

BACKGROUND

With the rapid development of smart terminal technologies, full screens have gradually become the mainstream screens of existing smart terminals such as smart phones.

In related technologies, according to a method for preventing a full screen from shielding a sensor on the front side of a terminal and a front camera, the sensor and the front camera are arranged under the display screen, and a material of an anode of the display screen is replaced with a light-transmitting material.

SUMMARY

According to a first aspect of embodiments of the present disclosure, there is provided a pixel display component. The pixel display component is used in a display screen and includes a light-emitting unit and an anode. The anode includes a first anode portion and a second anode portion arranged in a direction parallel to the display screen. The first anode portion includes a light-transmitting material, and the second anode portion includes a non-light-transmitting material.

According to a second aspect of the embodiments of the present disclosure, there is provided a screen display component, which includes at least one pixel display component according to the first aspect.

According to a third aspect of the embodiments of the present disclosure, there is provided a screen display, which includes at least one first screen display component. The first screen display component is the screen display component according to the second aspect.

According to a fourth aspect of the embodiments of the present disclosure, there is provided a terminal, which includes at least one display screen according to the third aspect.

The technical solutions provided by the embodiments of the present disclosure at least include following beneficial effects.

The pixel display component is used in a display screen, and the pixel display, component includes a light-emitting unit and an anode. The anode includes a first anode portion and a second anode portion arranged in a direction parallel to the display screen. The first anode portion includes a light-transmitting material, and the second anode portion includes a non-light-transmitting material. The light-emitting unit is arranged between a cathode and the anode of the display screen, and the anode is arranged between a substrate of the display screen and the light-emitting unit. According to the present disclosure, the first anode portion and the second anode portion are arranged in the pixel display component, and the first anode portion has a better effect on diverging light emitted from the light-emitting unit. In this way, the display effect of a location of the pixel display component is improved under the premise of ensuring light transmittance of the location of the pixel display component in the display screen.

It is to be understood that the above general description and the detailed description below are merely exemplary and explanatory, and do not limit the present disclosure.

BRIEF DESCRIPTION OF THE DRAWINGS

The accompanying drawings herein are incorporated in and constitute a part of this specification, illustrate embodiments conforming to the present disclosure and, together with the description, serve to explain the principles of the present disclosure.

DETAILED DESCRIPTION

Reference will now be made in detail to exemplary embodiments, examples of which are illustrated in the accompanying drawings. The following description refers to the accompanying drawings in which the same numbers in different drawings represent the same or similar elements, unless otherwise represented. The implementations set forth in the following exemplary embodiments do not represent all implementations consistent with the present disclosure. Instead, they are merely examples of apparatuses and methods consistent with aspects related to the present disclosure as recited in the appended claims.

Embodiments of the present disclosure may be used in an application scenario in the design of a display screen in a smart device.

In the embodiments, a pixel, also referred to as an image element, may be the smallest unit representing an image. For example, an image may be constituted by a plurality of small blocks, each of these small blocks has an explicit location and an assigned color value, and these small blocks may be considered as pixels of the image. When a screen (such as a display screen) of a computer device displays an image, one pixel of the image may be displayed through one or more pixel display components.

In the embodiments, a drive circuit may include seven thin film transistors (TFTs) and one storage capacitor (C), which may be referred to as a 7T1C circuit.

In the embodiments, vapor deposition is a method in which a plating material is heated in a vacuum environment, such that the plating material is vaporized and deposited on a surface of a material to be plated to obtain a thin film material.

Figure 1:
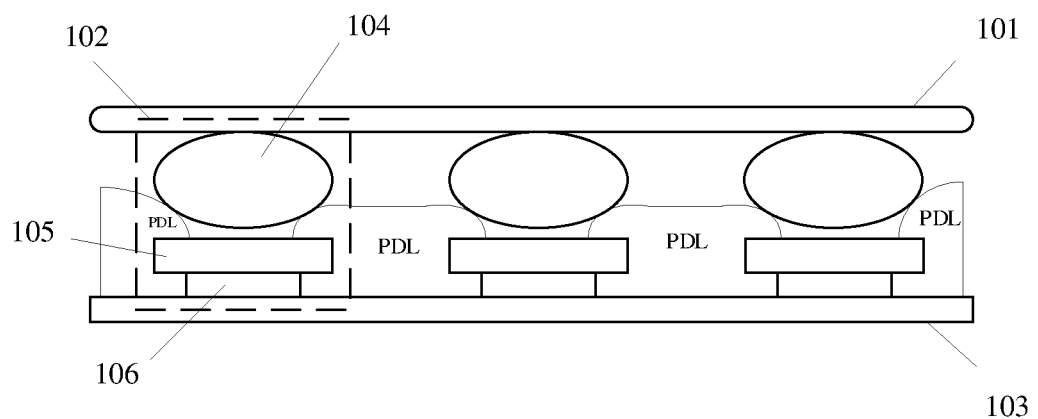
FIG. 1 is a schematic cross-sectional view showing a stacked arrangement of pixel display components of an OLED according to an embodiment.

FIG. 1 is a schematic cross-sectional view showing a stacked arrangement of pixel display components of an organic light-emitting diode (OLED) display, according to an embodiment. As shown in FIG. 1, a screen display component of the OLED display screen includes a cathode 101, a pixel display component 102, and a substrate 103. The pixel display, components 102 are separated by a pixel define layer (PDL). The pixel display component 102 includes a light-emitting unit 104, an anode 105, and a drive circuit 106. The cathode 101 is made from magnesium-silver (Mg/Ag) material. The light-emitting unit 104 may be a red OLED material, a green OLED material or a blue OLED material. The anode 105 is made front a mixed material of indium tin oxide (ITO) and silver (Ag) or a laminated material thereof (for example, the Ag material is provided on the surface of the ITO material). The drive circuit 106 may be a 7T1C circuit, a 6T1C circuit, a 5T2C circuit, or the like. The substrate 103 may be a glass substrate or a polyimide (PI) substrate, etc. In an embodiment, a plurality of pixel display components may be included.

In an embodiment, the drive circuit 106 may be fabricated using low temperature poly-silicon (UPS) or indium gallium zinc oxide (IGZO) display technology. In an embodiment, the drive circuit 106 may further include a scan line and a data line.

In the structure as shown in FIG. 1 where the pixel display components of the OLED are in a stacked arrangement, the material of the anode 105 is a non-light-transmitting material, and the drive circuit 106 is also non-light-transmitting. Therefore, if a device such as a camera or a sensor is arranged under the region, the device may not collect a light signal above the pixel display component of the OLED, such that the display screen may need an OLED in a different structure to implement a full screen.

Figure 2:
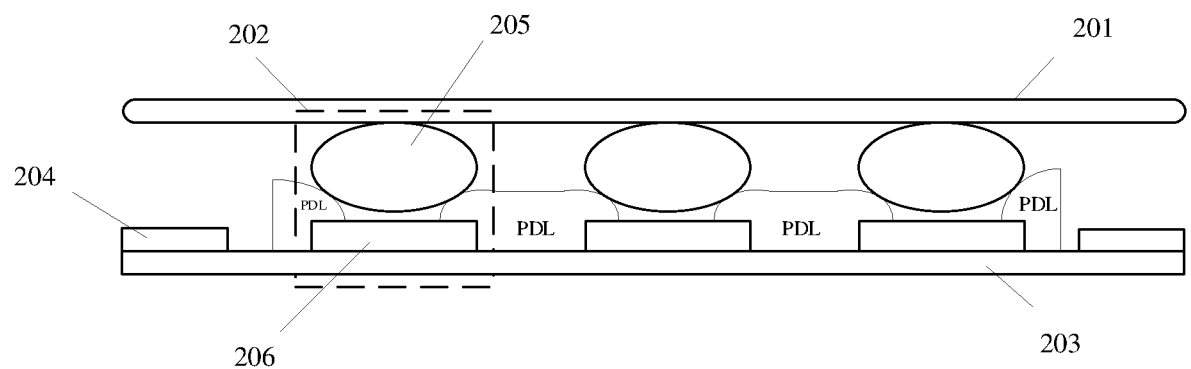
FIG. 2 is a schematic cross-sectional view showing a stacked arrangement of pixel display components of an OLED according to an embodiment.

In some embodiments, in order to prevent the device such as the camera or the sensor arranged under the display screen from being shielded from light, the stacked arrangement of the pixel display components of the OLED may be adjusted. FIG. 2 is a schematic cross-sectional view showing a stacked arrangement of pixel display components of an OLED display according to an embodiment. As shown in FIG. 2, the screen display component of the OLED display screen is formed by a cathode 201, a plurality of pixel display components 202, a substrate 203, and a drive circuit 204. The pixel display components 202 are also separated by a pixel define layer (PDL). The pixel display component 202 includes a light-emitting unit 205 and an anode 206. In this embodiment, the drive circuit in FIG. 1 is moved to the position as shown in FIG. 2 (i.e., the position outside the pixel display component, at two sides of the pixel display component). In addition, in this embodiment, the anode 206 is completely made of the ITO material, such that the light transmittance of the anode is improved. Furthermore, the cathode 201 is made of a material better than the Mg/Ag material in light transmittance, and thus the light transmittance of the cathode is also improved. In an embodiment, materials of the substrate 203, the drive circuit 204, and the light-emitting unit 205 may be similar to the materials as shown in FIG. 1.

Figure 3:
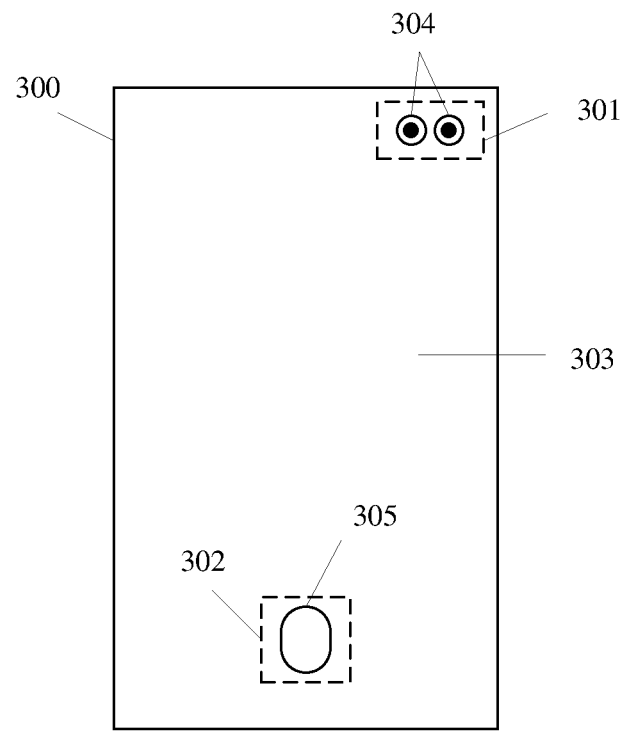
FIG. 3 is a schematic diagram of a display screen according to an embodiment.

FIG. 3 is a schematic diagram of a display screen 300 according to an embodiment. As shown in FIG. 3, the display screen 300 includes a first screen region 301, a second screen region 302, a remaining screen region 303, an under-screen camera 304, and an under-screen fingerprint sensor 305. In an embodiment, in the first screen region 301 and the second screen region 302, the pixel display components of the OLED may be arranged in the stacked arrangement as shown in FIG. 2. In the remaining screen region 303, the pixel display components of the OLED may be arranged in the stacked arrangement as shown in FIG. 1, or may be arranged in the stacked arrangement as shown in FIG. 2. As shown in FIG. 3, under the first screen region 301 there is provided with an under-screen camera 304. In an embodiment, since the materials used in each pixel display component of the first screen region 301 may be light-transmissive, the under-screen camera 304 can capture and recognize information outside the screen through the first screen region 301 to complete the capture of the camera under the screen. Under the second screen region 302 there is provided with an under-screen fingerprint sensor 305. Similarly, since the material of the second screen region 302 is also light-transmissive, the under-screen fingerprint sensor 305 can capture and recognize fingerprint information outside the screen through the second screen region 302 to complete the capture of the fingerprint sensor under the screen. In this way, full screen display of the display screen is implemented. In addition to the camera and the fingerprint sensor, other sensors such as a light sensor, a distance sensor, etc. that need to capture light may be arranged under the light-transmission region of the display screen 300.

In some embodiments, a stronger light transmittance of a certain region in the display screen in FIG. 2 may result in a degraded screen display effect of that region. In some embodiments, when the display screen in FIG. 3 displays, if the pixel display components in the first screen region and the second screen region are arranged using the arrangement as shown in FIG. 2 and other pixel display components in the display screen are arranged using the arrangement as shown in FIG. 1, the light transmittance of the first screen region and the light transmittance of the second screen region in the display screen may be different from the light transmittances of other regions in the display screen. Correspondingly, when the display screen displays, the display effect of the first screen region and the display effect of the second screen region may be different from the display effects of other screen regions, such that the overall display effect of the display screen may be reduced.

Figure 4:
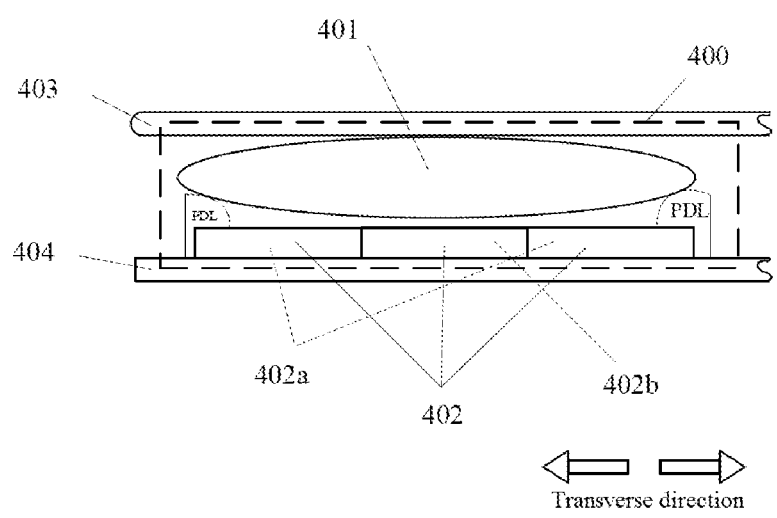
FIG. 4 is a schematic side view showing a structure of a pixel display component according to an embodiment.

FIG. 4 is a schematic side view showing a structure of a pixel display component 400 according to an embodiment. As shown in FIG. 4, the pixel display component 400 includes a light-emitting unit 401 and art anode 402.

The anode 402 includes a first anode portion 402a and a second anode portion 402h arranged in a direction parallel to the display screen. In an embodiment, a material of the first anode portion 402a is a light-transmitting material, and a material of the second anode portion 402b includes a non-light-transmitting material.

In an embodiment, the direction parallel to the display screen may be a transverse indication direction as shown in FIG. 4. The first anode portion 402a and the second anode portion 402b may be arranged in the transverse direction as shown in FIG. 4. In an embodiment, the number of the first anode portion 402a and the second anode portion 402b may be arbitrary, or the ratio between the area of the first anode portion 402a and the area of the second anode portion 402b may be set by developers according to actual needs.

In an embodiment, the material of the first anode portion 402a may be a light-transmitting material, and a material of the second anode portion 402b may be a non-light-transmitting material. In an embodiment, the light-transmitting material and the non-light-transmitting material may be defined by the light transmittance of the material. For example, if the light transmittance of a first material is not less than that of the ITO material, the first material may be referred to as the light-transmitting material. If the light transmittance of a second material is less than that of the ITO material, the first material may be referred to as the non-light-transmitting material.

In an embodiment, shown in FIG. 4, the light-emitting unit 401 may be arranged between a cathode 403 and the anode 402 of the display screen, and the anode 402 is arranged between a substrate 404 of the display screen and the light-emitting unit 401. The anode 402 may be arranged on the substrate 404 of the display screen in the transverse direction as shown in FIG. 4.

In the embodiments of the present disclosure, a pixel display component is used in the display screen, and the pixel display component includes a light-emitting unit and an anode. The anode includes a first anode portion and a second anode portion arranged transversely. The material of the first anode portion is a light-transmitting material, and the material of the second anode portion is a non-light-transmitting material. The light-emitting unit is arranged between the cathode and the anode of the display screen, and the anode is arranged between the substrate of the display screen and the light-emitting unit. According to the present disclosure, the first anode portion and the second anode portion are arranged in the pixel display component, and the first anode portion has a better effect on diverging light emitted from the light-emitting unit. In this way, the display effect of a location of the pixel display component is improved under the premise of ensuring light transmittance of the location of the pixel display component in the display screen.

Figure 5:
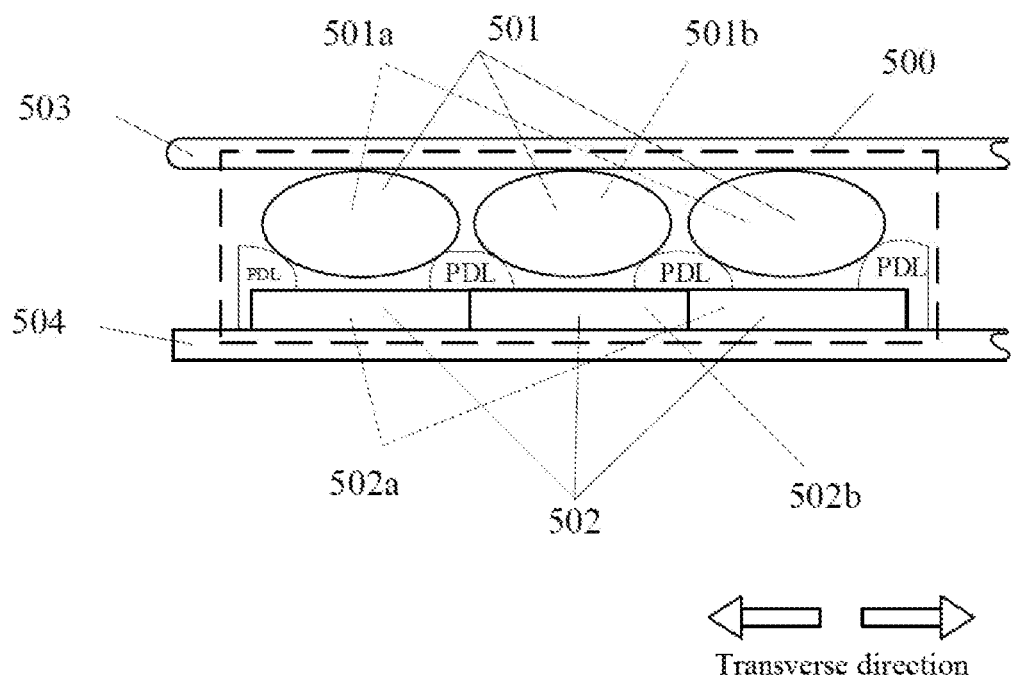
FIG. 5 is a schematic side view showing a structure of a pixel display, component according to an embodiment.

In an embodiment, the light-emitting unit may correspond to different anode portions, and corresponding light-emitting unit portions may be designed, respectively. FIG. 5 is a schematic side view showing a structure of a pixel display component 500 according to an embodiment. As shown in FIG. 5, the pixel display component 500 includes a light-emitting unit 501 and an anode 502.

The anode 502 includes a first anode portion 502a and a second anode portion 502b arranged in a direction parallel to the display screen. In an embodiment, a material of the first anode portion 502a is a light-transmitting material, and a material of the second anode portion 502b includes a non-light-transmitting material.

In an embodiment, the direction parallel to the display screen may be the transverse indication direction as shown in FIG. 5, and the first anode portion 502a and the second anode portion 502b may be arranged in the transverse direction as shown in FIG. 5. In an embodiment, the anode 502 may include at least two first anode portions 502a, and/or, the anode 502 may include at least two second anode portions 502b. That is, the number of the first anode portions 502a and the second anode portions 502b may be arbitrary, or the ratio between the area of the first anode portion 502a and the area of the second anode portion 502b may be set by developers according to actual needs. That is, in the pixel display component 500 as shown in FIG. 5, the anode 502 may be divided into at least two first anode portions and at least two second anode portions.

Figure 6:
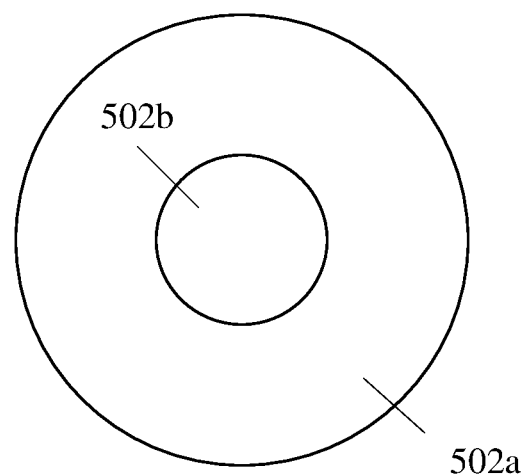
FIG. 6 is a plan view of the pixel display component in FIG. 5 according to an embodiment.
Figure 7:
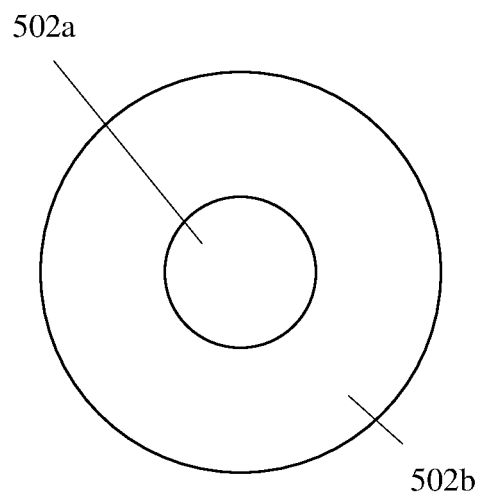
FIG. 7 is a plan view of a pixel display component according to an embodiment.

In an embodiment, the first anode portion 502a may surround the second anode portion 502b, or the second anode portion 502b may surround the first anode portion 502a. FIG. 6 is a plan view of the pixel display component in FIG. 5 according to an embodiment. As shown in FIG. 6, the pixel display component includes the first anode portion 502a and the second anode portion 502b. In an embodiment, the second anode portion 502b may be arranged at a pixel center, and a corresponding schematic side view thereof is shown in FIG. 5. The first anode portion surrounds the periphery of the second anode portion, i.e., the first anode portion 502a completely surrounds the second anode portion 502h. In an embodiment, the location, the size or the like of the second anode portion 502h in FIG. 6 may also be set by developers according to actual needs. FIG. 7 is a plan view of a pixel display component according to another embodiment. In FIG. 7, the first anode portion 502a is arranged at a pixel center, and the second anode portion 502b surrounds the periphery of the first anode portion 50:2a, i.e., the second anode portion 502b completely surrounds the first anode portion 502a.

Figure 8:
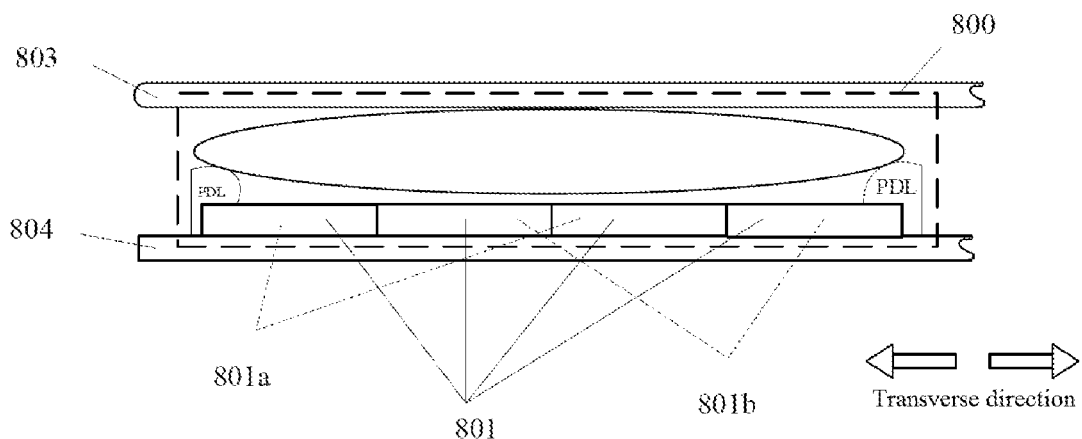
FIG. 8 is a schematic side view showing a structure of a pixel display component according to an embodiment.
Figure 9:
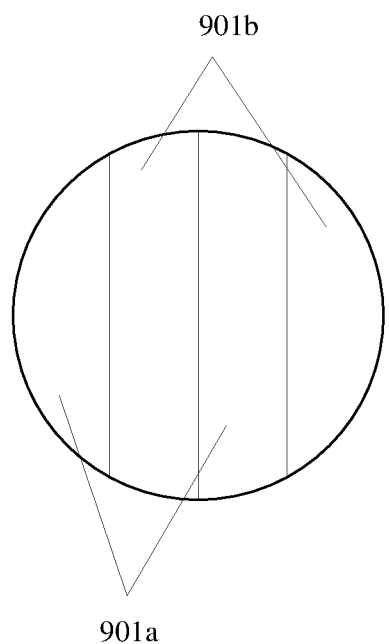
FIG. 9 is a plan view of the pixel display component FIG. 8 according to an embodiment.

In some embodiments, the anode in the above pixel display component may include at least two first anode portions, and/or the anode in the above pixel display component may include at least two second anode portions. For example, FIG. 8 is a schematic side view of a structure of a pixel display component 800 according to an embodiment. As shown in FIG. 8, the pixel display component 800 includes an anode 801, which is divided into two first anode portions 801a and two second anode portions 801b. In FIG. 8, a light-emitting unit is arranged between a cathode 803 and the anode 801 of the display screen, and the anode 801 is arranged between a substrate 804 of the display screen and the light-emitting unit. FIG. 9 is a plan view of the pixel display component in FIG. 8 according to an embodiment. The locations of the two first anode portions 801a and the two second anode portion 801b in FIG. 8 are illustrated in FIG. 9. The anode may be divided into two first anode portions and two second anode portions in the form as shown in FIG. 9. In an embodiment, the pixel display component may also be square or rectangular. That is, the shape of the anode as shown in FIG. 9 may be square or rectangular, and the anode may include a plurality of first anode portions and a plurality of second anode portions. The embodiments of the present disclosure are not limited thereto.

Figure 10:
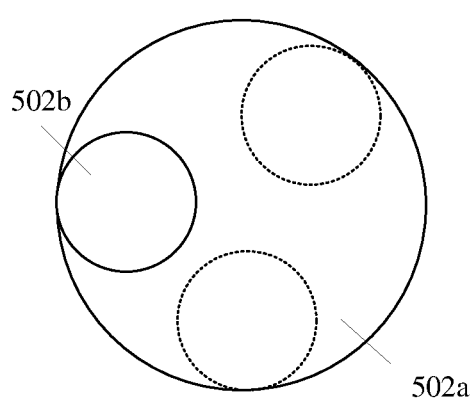
FIG. 10 is a plan view of the pixel display component in FIG. 5 according to an embodiment.

In an embodiment, the locations of the first anode portion 502a and the second anode portion 502b transversally arranged may be changed to form a case where the first anode portion 502a does not completely surround the second anode portion 502b. FIG. 10 is a plan view of the pixel display component in FIG. 5 according to an embodiment. As shown in FIG. 10, the pixel display component includes an anode which includes the second anode portion 502b and the first anode portion 502a arranged transversely, and the second anode portion 502b as shown in FIG. 10 is different from the second anode portion 502h as shown in FIG. 5 in location. In an embodiment, as shown in FIG. 10, the second anode portion 502b may also be arranged at other locations (as indicated by dashed lines in FIG. 10). In an embodiment, the locations of the first anode portion and the second anode portion included in the anode as shown in FIG. 8 may also be changed to form a case where the second anode portion does not completely surround the first anode portion. The embodiments of the present disclosure are not limited thereto.

In an embodiment, a material of the first anode portion may be a light-transmitting material, and a material of the second anode portion may be a non-light-transmitting material. In an embodiment, the light-transmitting material and the non-light-transmitting material may be defined by the light transmittance of the material. For example, if the light transmittance of a first material is not less than that of the ITO material, the first material may be referred to as the light-transmitting material. If the light transmittance of a second material is less than that of the ITO material, the first material may be referred to as the non-light-transmitting material.

Referring back to FIG. 5, the light-emitting unit 501 may be arranged between a cathode 503 and the anode 502 of the display screen, and the anode 502 is arranged between a substrate 504 of the display screen and the light-emitting unit 501.

In an embodiment, the light-emitting unit 501 may further include a first light-emitting unit portion 501a and a second light-emitting unit portion 501b.

The first light-emitting unit portion 501a corresponds to the first anode portion 502a, and the second light-emitting unit portion 501b corresponds to the second anode portion 502b.

As shown in FIG. 5, the first anode portion 502a corresponds to the first light-emitting unit portion 501a, and the second anode portion 502b corresponds to the second light-emitting unit portion 501b. In an embodiment, the first anode portion and the second anode portion as shown in FIG. 8 may also respectively correspond to their own first light-emitting unit portion and second light-emitting unit portion.

In an embodiment, the first light-emitting unit portion 501a and the second light-emitting unit portion 501b are separated by a pixel define layer (PDL). As shown in FIG. 5, the PDL may be arranged between the anode and the cathode. When being vapor-deposited to the PDL on the anode, the light-emitting materials of the light-emitting unit portions may be separated from each other by the PDL, such that the light-emitting materials are at different locations and correspond to different anode portions to form the light-emitting unit portions. That is, the PDL may also control the vapor deposition range of the light-emitting materials of the light-emitting unit.

Figure 11:
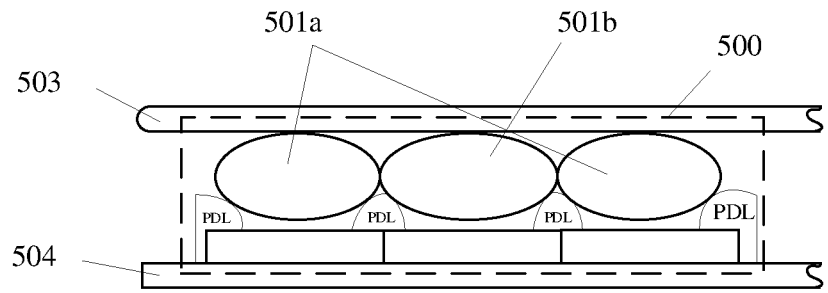
FIG. 11 is a schematic side view showing a structure of the pixel display component in FIG. 5 according to an embodiment.

In an embodiment, the first light-emitting unit portion 501a may be connected to the second light-emitting unit portion 501b. FIG. 11 is a schematic side view showing the structure of the pixel display component in FIG. 5 according to an embodiment. As shown in FIG. 11, the first light-emitting unit portion 501a may be connected, above the PDL, to the second light-emitting unit portion 501b.

In an embodiment, the light-emitting materials used in the first light-emitting unit portion and the second light-emitting unit portion may be arbitrarily configured by the developers. In an embodiment, the constituent material of the light-emitting unit 501 is a red OLED material, a green OLED material, or a blue OLED material. The first light-emitting unit portion may be made of any one of the above three OLED materials, and the second light-emitting unit portion may also be made of any one of the above three OLED materials. In an embodiment, the first light-emitting unit portion on the left of the first light-emitting unit as shown in FIG. 5 and the first light-emitting unit portion on the right of the first light-emitting unit may use the same OLED material or may use different OLED materials. The first light-emitting unit portion and the second light-emitting unit portion as shown in FIG. 5 may use the same OLED material or may use different OLED materials.

In an embodiment, the constituent material of the first anode portion 502.a may be an indium tin oxide (ITO) material, or the constituent material of the first anode portion 502a may be a material higher than the ITO material in light transmittance. The constituent material of the second anode portion 502b may use a mixed material or laminated material of the ITO material and a silver material. The constituent material of the second anode portion may be the same as the material used for the anode as shown in FIG. 1.

In an embodiment, the constituent material of the cathode may be a silver-magnesium mixed material, or the constituent material of the cathode may be a material higher than the silver-magnesium mixed material in light transmittance.

In the embodiments of the present disclosure, a pixel display component is used in the display screen, and the pixel display component includes a light-emitting unit and an anode. The anode includes a first anode portion and a second anode portion arranged in a direction parallel to the display screen. The material of the first anode portion may be a light-transmitting material, and the material of the second anode portion may include a non-light-transmitting material. The light-emitting unit is arranged between the cathode and the anode of the display screen, and the anode is arranged between the substrate of the display screen and the light-emitting unit. According to the present disclosure, the first anode portion and the second anode portion are arranged in the pixel display component, and the first anode portion has a better effect on diverging light emitted from the light-emitting unit. In this way, the display effect of a location of the pixel display component is improved under the premise of ensuring light transmittance of the location of the pixel display component in the display screen.

Figure 12:
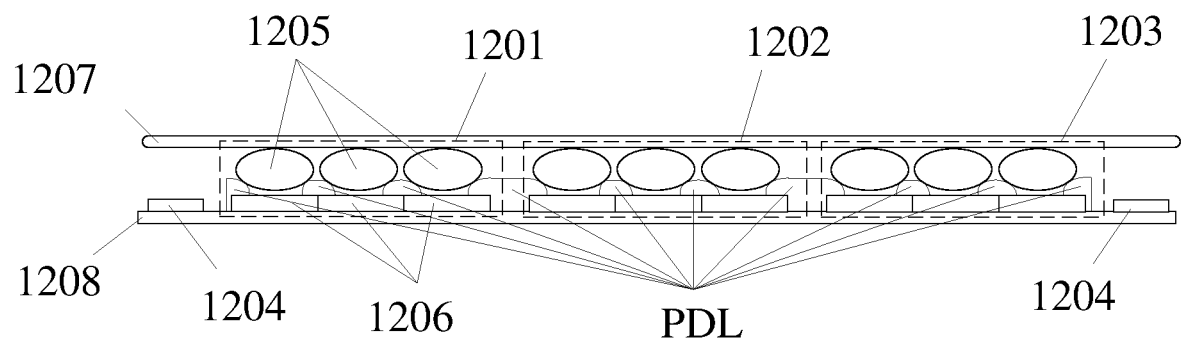
FIG. 12 is a schematic side view of a screen display component including the pixel display component shown in FIG. 5 according to an embodiment.

FIG. 12 is a schematic side view of a screen display component according to an embodiment. The screen display component may include at least one pixel display, component as shown in FIG. 5. In an embodiment, the screen display component further includes a drive circuit. As shown in FIG. 12, the screen display component includes a first pixel display component 1201, a second pixel display component 1202, a third pixel display component 1203, and a drive circuit 1204.

The first pixel display component 1201 includes a light-emitting unit 1205 and an anode 1206. In an embodiment, as shown in FIG. 12, a cathode 1207 and a substrate 1208 of the display screen are further included. Reference may be made to the light-emitting unit and the anode as shown in FIG. 4 or FIG. 5 for the light-emitting unit 1205 and the anode 1206. FIG. 12 shows that the screen display component includes three pixel display components as an example. In practical application, one screen display component may include more or less pixel display components.

In an embodiment, the anode portions in the second pixel display component 1202 of the screen display component may be structurally the same as those in the first screen display component 1201. That is, both the second pixel display component 1202 and the first pixel display component 1201 may be the pixel display components as shown in FIG. 5. In an embodiment, the anode portions included in the second pixel display component 1202 may also be all made of non-transparent materials. For example, the second pixel display component 1202 is the pixel display component as shown in FIG. 1. In an embodiment, the anode portions included in the second pixel display component 1202 may also be all made of transparent materials. For example, the second pixel display component 1202 is the pixel display component as shown in FIG. 2. That is, in the screen display component provided by the embodiments of the present disclosure, the pixel display components as shown in FIG. 1 and FIG. 2 may be used in any combination with the pixel display component as shown in FIG. 4 or FIG. 5 to form the screen display component including at least one pixel display component as shown in FIG. 4 or FIG. 5.

In an embodiment, the drive circuit 1204 may be arranged at a location other than the location of the at least one pixel display component, and the drive circuit 1204 is electrically connected to the at least one pixel display component. In an embodiment, as shown in FIG. 12, the drive circuit 1204 may be arranged on two sides of the plurality of pixel display components. In an embodiment, the drive circuit 1204 may be electrically, connected to the plurality of pixel display components, and may control the voltage between the anodes of the plurality of pixel display components and the cathode of the display screen, so as to control the operation of each of the pixel display components.

Figure 13:
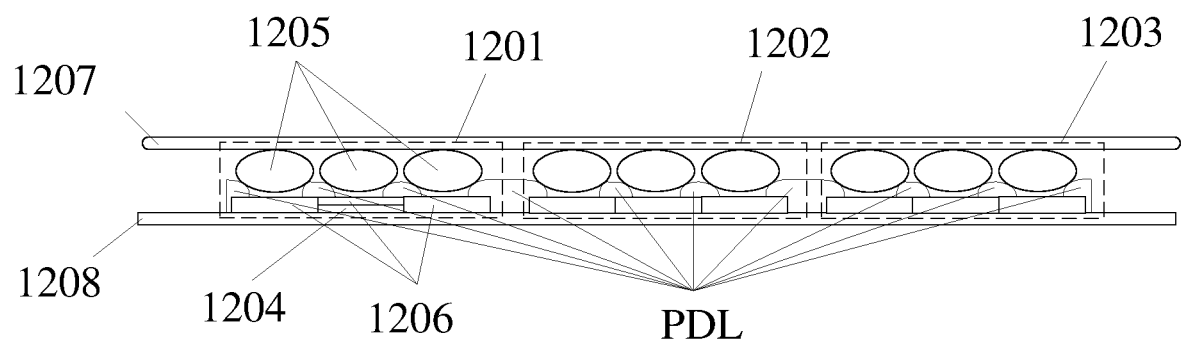
FIG. 13 is a schematic side view of the screen display component in FIG. 12 according to an embodiment.

In an embodiment, the drive circuit 1204 as shown in FIG. 12 may also be arranged between the second anode portion of the at least one pixel display component and the substrate, and the drive circuit 1204 is electrically connected to the at least one pixel display component respectively. For example, in the anode 1206 as shown in FIG. 12, the middle anode portion is the second anode portion, and the drive circuit 1204 may also be arranged between the middle anode portion of the anode 1206 and the substrate. FIG. 13 is a schematic side view of the screen display component in FIG. 12 according to an embodiment. The drive circuit 1204 may be arranged in a location shown in FIG. 13. That is, the drive circuit 1204 may be arranged between the anode portion made of a non-transparent material and the substrate. In an embodiment, one drive circuit may control a plurality of pixel display components, and the number of the drive circuits may be determined by the requirements of the practical application, which is not limited by the embodiments of the present disclosure.

Figure 14:
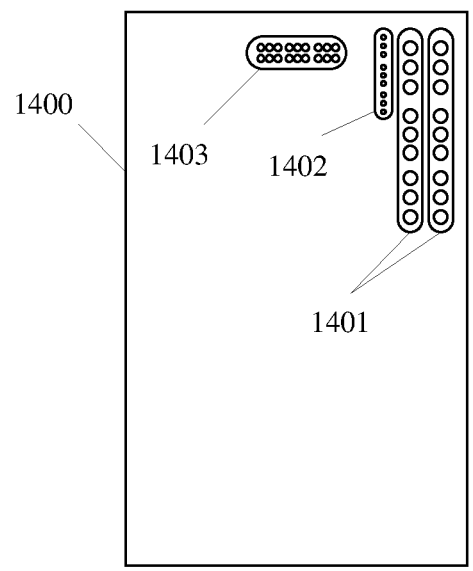
FIG. 14 shows a display screen according to an embodiment.

FIG. 14 is a display screen 1400 according to an embodiment. The display screen 1400 includes at least one first screen display component 1401, and the first screen display component 1401 may be the screen display component as shown in FIG. 12.

In an embodiment, the display screen 1400 may further include at least one second screen display component, and the anode of the second screen display component is made of a light-transmitting material. For example, in FIG. 14, a second screen display component 1402 is further included, and the anode of the second screen display component 1402 may be all made of a light-transmitting material, such as the screen display component constituted by the pixel display component as shown in FIG. 2. In an embodiment, the display screen 1400 may further include at least one third screen display component, and the anode of the third screen display component may be made from a non-light-transmitting material. For example, in FIG. 14, a third screen display component 1403 is further included, and the anodes of the pixel display components in the third screen display component 1403 may be all made from non-light-transmitting materials, such as the screen display component constituted by the pixel display component as shown in FIG. 1. It is to be noted that the number of the first screen display components, the number of the second screen display components and the number of the third screen display components included in the display screen are not limited in the embodiments of the present disclosure. That is, the second screen display component and the third screen display component may be selected correspondingly, for the display screen including the first screen display component, and finally, display and the like of the display screen are implemented by these screen display components.

Figure 15:
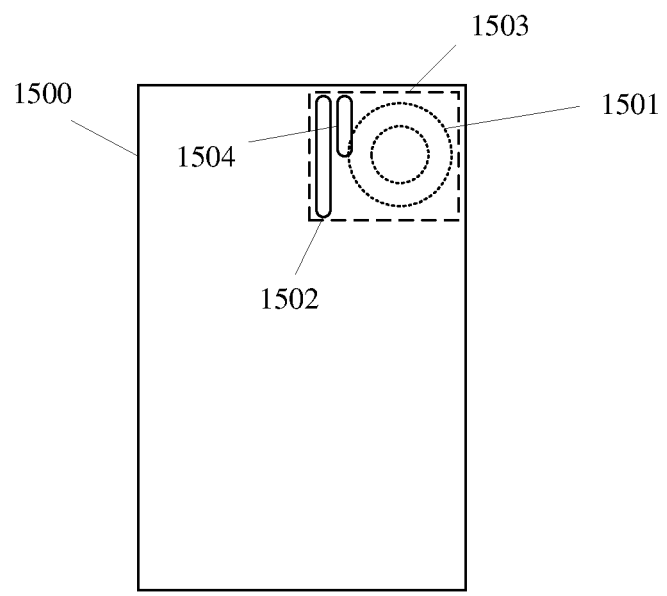
FIG. 15 is a plan view of a terminal according to an embodiment.

FIG. 15 is a plan view of a terminal according to an embodiment. As shown in FIG. 15, the terminal may include at least one display screen 1500, and the display screen 1500 may be the display screen as shown in FIG. 14. In an embodiment, the terminal further includes an under-screen component 1501 arranged under the display screen 1500, and the display screen 1500 includes at least one first screen display component 1502. The first screen display component 1502 may be the screen display component as shown in FIG. 12, and the first screen display component 1502 may be arranged within a first screen region 1503 of the display screen 1500. The first screen region 1503 may be a screen region corresponding to the under-screen component 1501.

In an embodiment, the first screen region 1503 may further include a second screen display component 1504, and the second screen display component 1504 is a screen display component provided with the pixel display component as shown in any one of the FIG. 1 and the FIG. 2. That is, in the first screen region 1502, there may be the screen display component as shown in FIG. 12 or other types of screen display components. For example, the anodes in the pixel display components of the screen display component are all made of non-transparent materials, or the anodes in the pixel display components of the screen display component are all made of transparent materials. In an embodiment, the developers may also flexibly configure each type of screen display component in the first screen region according to actual conditions.

In an embodiment, a proportion of a non-light-transmission area of the pixel display component in the first screen display component is positively correlated with a center distance. The proportion of the non-light-transmission area is a ratio of an area of the second anode portion in the pixel display component to an area of the anode in the pixel display component, and the center distance is a distance between a center of the anode and a center of the under-screen component.

In an embodiment, when a first screen display component is configured in the first screen region, the area of the second anode portion of the pixel display component in the first screen display component may be determined according to the distance between the center of the anode in the first screen display component and the center of the under-screen component. For example, the area of the second anode portion occupying the anode of the pixel display component is positively correlated with the distance between the center of the anode in the first screen display component and the center of the under-screen component.

Figure 16:
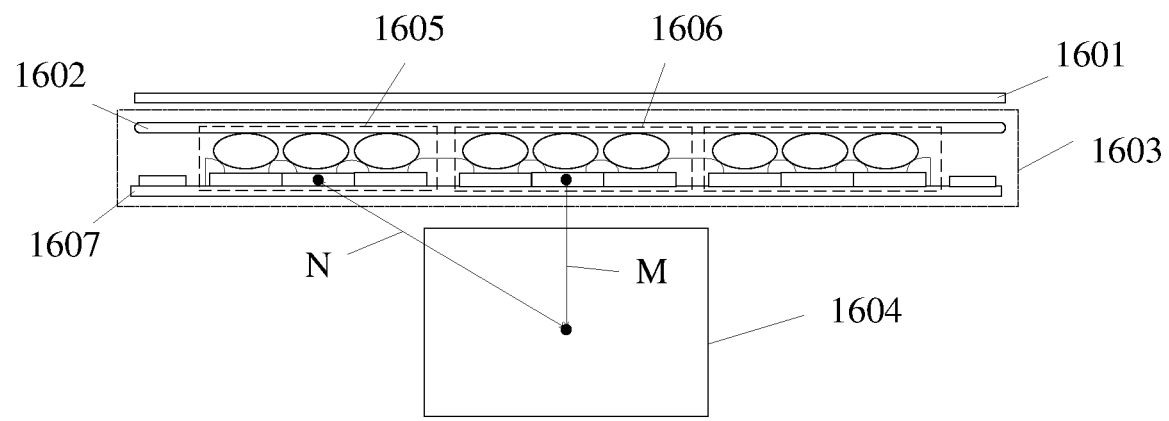
FIG. 16 is a schematic side view of a terminal according to an embodiment.

FIG. 16 is a schematic side view of a terminal according to an embodiment. As shown in FIG. 16, the terminal includes a display screen 1601, a cathode 1602, a first screen display component 1603, an under-screen component 1604, a first pixel display component 1605, a second pixel display component 1606, and a substrate 1607. The distance between the center of the anode of the first pixel display component 1605 and the under-screen component 1604 is N, and the distance between the center of the anode of the second pixel display component 1606 and the under-screen component 1604 is M. When N>M, the ratio of the area of the second anode portion included in the first pixel display component 1605 to the area of the anode in the first pixel display component 1605 may also be correspondingly greater than the ratio of the area of the second anode portion included in the second pixel display component 1606 to the area of the anode in the second pixel display component 1606.

Figure 17:
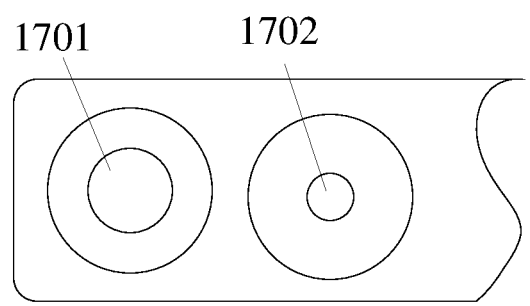
FIG. 17 is a plan view of the terminal in FIG. 16 according to an embodiment.

FIG. 17 is a plan view of the terminal in FIG. 16 according to an embodiment. As shown in FIG. 17, the area of the second anode portion 1701 included in the first pixel display component 1605 is greater than that of the second anode portion 1702 included in the second pixel display component 1606. In a case where the areas of the anodes included in the pixel display components are equal, the ratio of the non-light-transmission area included in the first pixel display component is greater than that of the non-light-transmission area included in the second pixel display component.

Figure 18:
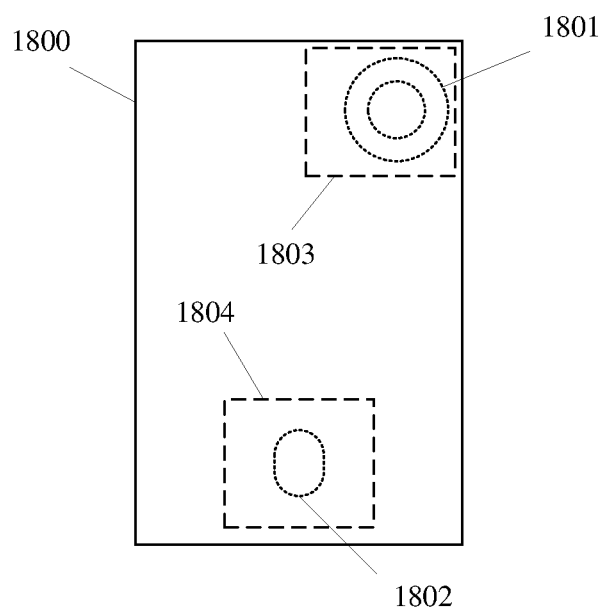
FIG. 18 is a plan view of a terminal according to an embodiment.

In an embodiment, the under-screen component 1501 (FIG. 15) may be at least one of a camera component and a sensor component. That is, the terminal may set different under-screen components under different screen regions, and different under-screen components correspond to respective first screen regions. FIG. 18 is a plan view of a terminal according to an embodiment. As shown in FIG. 18, the terminal includes a display screen 1800, a first under-screen component 1801, and a second under-screen component 1802. The display screen 1800 may also include a first screen display region 1803 corresponding to the first under-screen component 1801 and a second screen display region 1804 corresponding to the second under-screen component 1802. In an embodiment, settings of the first screen display region 1803 corresponding to the first under-screen component 1801 and settings of the second screen display region 1804 corresponding to the second under-screen component 1802 may be similar to those of the first screen display region as shown in FIG. 15.

In the embodiments of the present disclosure, a pixel display component is used in the display screen, and the pixel display component includes a light-emitting unit and an anode. The anode includes a first anode portion and a second anode portion arranged in a direction parallel to the display screen. The material of the first anode portion may be a light-transmitting material, and the material of the second anode portion may include a non-light-transmitting material. The light-emitting unit is arranged between the cathode and the anode of the display screen, and the anode is arranged between the substrate of the display screen and the light-emitting unit. According to the present disclosure, the first anode portion and the second anode portion are arranged in the pixel display component, and the first anode portion has a better effect on diverging light emitted from the light-emitting unit. In this way, the display effect of a location of the pixel display component is improved under the premise of ensuring light transmittance of the location of the pixel display component in the display screen.

Other embodiments of the present disclosure will be apparent to those skilled in the art in consideration of the specification and upon practice of the invention disclosed here. The present disclosure is intended to cover any variations, uses, or adaptations of the present disclosure following the general principles thereof and including such departures from the present disclosure as come within known or customary practice in the art. It is intended that the specification and embodiments be considered as exemplary only, with a true scope and spirit of the present disclosure being indicated by the following claims.

It will be appreciated that the present disclosure is not limited to the exact construction that has been described above and illustrated in the accompanying drawings, and that various modifications and changes can be made without departing from the scope thereof. It is intended that the scope of the present disclosure only be limited by the appended claims.

What is claimed is:

1. A pixel display component used in a display screen, comprising:
   a light-emitting unit and an anode, wherein:
   the anode comprises a first anode portion and a second anode portion arranged in a direction parallel to the display screen, the first anode portion comprises an indium tin oxide (ITO) material as a light-transmitting material, and the second anode portion comprises a mixed material or laminated material of the ITO material and a silver material as a non-light-transmitting material; and
   the light-emitting unit is arranged between a cathode and the anode, and the anode is arranged between a substrate of the display screen and the light-emitting unit.

2. The pixel display component according to claim 1, wherein:
   the first anode portion completely or incompletely surrounds the second anode portion.

3. The pixel display component according to claim 1, wherein the anode comprises at least two first anode portions.

4. The pixel display component according to claim 3, wherein the anode further comprises at least two second anode portions.

5. The pixel display component according to claim 1, wherein:
   the light-emitting unit comprises a first light-emitting unit portion and a second light-emitting unit portion;
   the first light-emitting unit portion corresponds to the first anode portion, and the second light-emitting unit portion corresponds to the second anode portion; and
   the first light-emitting unit portion is connected to the second light-emitting unit portion.

6. The pixel display component according to claim 1, wherein:
   the light-emitting unit comprises a first light-emitting unit portion and a second light-emitting unit portion;
   the first light-emitting unit portion corresponds to the first anode portion, and the second light-emitting unit portion corresponds to the second anode portion; and
   the first light-emitting unit portion is spaced apart from the second light-emitting unit portion by a pixel define layer (PDL).

7. The pixel display component according to claim 1, wherein the light-emitting unit comprises at least one of a red organic light-emitting diode (OLED) material, a green OLED material, or a blue OLED material.

8. A pixel display component used in a display screen, comprising:
a light-emitting unit and an anode, wherein:
the anode comprises a first anode portion and a second anode portion arranged in a direction parallel to the display screen, the first anode portion comprises a light-transmitting material, and the second anode portion comprises a non-light-transmitting material; and
the light-emitting unit is arranged between a cathode and the anode, the cathode comprises a silver-magnesium mixed material, and the anode is arranged between a substrate of the display screen and the light-emitting unit.

9. The pixel display component according to claim 8, wherein:
a light transmittance of a material of the cathode is greater than that of the silver-magnesium mixed material.

10. A screen display component, comprising at least one pixel display component according to claim 1.

11. The screen display component according to claim 10, further comprising a drive circuit electrically connected to the at least one pixel display component,
wherein the drive circuit is arranged at a location other than a location of the at least one pixel display component.

12. The screen display component according to claim 10, further comprising a drive circuit electrically connected to the at least one pixel display component,
wherein the drive circuit is arranged between the second anode portion of the at least one pixel display component and the substrate.

13. A terminal, comprising:
a display screen comprising a first screen display component; and
an under-screen component arranged under the display screen,
wherein the first screen display component comprises:
a light-emitting unit and an anode, wherein:
the anode comprises a first anode portion and a second anode portion arranged in a direction parallel to the display screen, the first anode portion comprises a light-transmitting material, and the second anode portion comprises a non-light-transmitting material; and
the light-emitting unit is arranged between a cathode and the anode, and the anode is arranged between a substrate of the display screen and the light-emitting unit;
wherein the first screen display component is arranged in a first screen region of the display screen, the first screen region corresponding to the under-screen component;
wherein the light-emitting unit and the anode are included in a pixel display component of the first screen display component, and a proportion of a non-light-transmission area of the pixel display component is positively correlated with a center distance; and
wherein the proportion of the non-light-transmission area is a ratio of an area of the second anode portion in the pixel display component to an area of the anode in the pixel display component, and the center distance is a distance between a center of the anode and a center of the under-screen component.

14. The terminal according to claim 13, the display screen further comprising: a second screen display component, wherein an anode of the second screen display component is made from a light-transmitting material.

15. The terminal according to claim 13, the display screen further comprising: a second screen display component, wherein an anode of the second screen display component is made from a non-light-transmitting material.

16. The terminal according to claim 13, wherein the under-screen component comprises at least one of a camera component or a sensor component.

* * * * *